United States Patent
Igawa et al.

(10) Patent No.: US 10,693,276 B2
(45) Date of Patent: Jun. 23, 2020

(54) OPTICAL TRANSMITTER

(71) Applicant: Mitsubishi Electric Corporation, Chiyoda-ku (JP)

(72) Inventors: Eitetsu Igawa, Tokyo (JP); Hiroyuki Ozaki, Tokyo (JP); Satoshi Ishitobi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/483,564

(22) PCT Filed: Mar. 31, 2017

(86) PCT No.: PCT/JP2017/013505
§ 371 (c)(1),
(2) Date: Aug. 5, 2019

(87) PCT Pub. No.: WO2018/179306
PCT Pub. Date: Oct. 4, 2018

(65) Prior Publication Data
US 2020/0136349 A1    Apr. 30, 2020

(51) Int. Cl.
*H01S 5/0683* (2006.01)
*H04B 10/564* (2013.01)
(Continued)

(52) U.S. Cl.
CPC ........ *H01S 5/0683* (2013.01); *H01S 5/02415* (2013.01); *H01S 5/06804* (2013.01);
(Continued)

(58) Field of Classification Search
CPC .............. H01S 5/02415; H01S 5/0683; H01S 5/06804; H04B 10/564
See application file for complete search history.

(56) References Cited

U.S. PATENT DOCUMENTS 6,229,832 B1 * 5/2001 Baba ............... H01S 5/06808
372/29.011
2010/0158055 A1 * 6/2010 Giebel ............... G06K 7/10584
372/29.011
(Continued)

FOREIGN PATENT DOCUMENTS

JP          4-324725 A    11/1992
JP       2008-135492 A     6/2008
(Continued)

OTHER PUBLICATIONS

Japanese Office Action dated Feb. 4, 2020 in Patent Application No. 2019-508081 (with English translation), 8 pages.
(Continued)

*Primary Examiner* — Nathan M Cors
(74) *Attorney, Agent, or Firm* — Oblon, McClelland, Maier & Neustadt, L.L.P.

(57) ABSTRACT

An optical transmitter includes: a semiconductor laser unit that outputs laser light of first output power and outputs a monitor current; a casing of an optical module that holds optical fiber; a monitor current detection unit that generates a monitor voltage; a laser driving unit that controls a laser driving current; a storage unit that stores information based on a result of a measurement of a ratio of second output power with respect to the first output power; a target voltage determination unit that changes the target voltage based on a detected temperature of a temperature sensor and the information based on the result of the measurement; and a power monitor value determination unit that generates a power monitor value indicating the second output power to be transmitted to a host device using the detected temperature and the information based on the result of the measurement.

4 Claims, 5 Drawing Sheets

(51) Int. Cl.
*H04B 10/079* (2013.01)
*H01S 5/024* (2006.01)
*H04B 10/50* (2013.01)
*H01S 5/068* (2006.01)

(52) U.S. Cl.
CPC ..... *H04B 10/07955* (2013.01); *H04B 10/503* (2013.01); *H04B 10/564* (2013.01)

(56) References Cited

U.S. PATENT DOCUMENTS

| | | | | |
|---|---|---|---|---|
| 2011/0085796 | A1* | 4/2011 | Motohiro | H04B 10/50595 398/25 |
| 2011/0243167 | A1* | 10/2011 | Castillo | H01S 5/06837 372/34 |
| 2013/0084065 | A1 | 4/2013 | Ishii | |
| 2017/0207602 | A1* | 7/2017 | Igawa | H01S 5/0683 |

FOREIGN PATENT DOCUMENTS

| | | | | |
|---|---|---|---|---|
| JP | 2013-76776 A | 4/2013 | | |
| WO | WO 2015/162964 | * 10/2015 | | H01S 5/0683 |
| WO | WO 2015/162964 A1 | 10/2015 | | |

OTHER PUBLICATIONS

International Search Report dated Jun. 13, 2017 in PCT/JP2017/013505 filed on Mar. 31, 2017.

* cited by examiner

OPTICAL TRANSMITTER

TECHNICAL FIELD

The present invention relates to an optical transmitter for use in an optical transmission system.

BACKGROUND ART

Automatic power control (APC) for an optical transmitter is known as a control method for maintaining constant output power of laser light from a semiconductor laser unit. In APC, a part of laser light output from a laser diode (LD) constituting a semiconductor laser unit is detected by a photodiode (PD), and a laser driving current to be supplied to the LD is controlled so that the value of a monitor current output from the PD is constant (feedback control) (see Patent Reference 1).

There also disclosed a technique of changing a voltage to be applied to a laser driving circuit in accordance with a temperature in an optical transmitter to thereby maintain constant output power of laser light from a semiconductor laser unit even upon occurrence of a temperature variation (see Patent Reference 1).

Prior Art Reference

Patent Reference

Patent Reference 1: Japanese Patent Application Publication No. 2013-76776 (e.g., FIGS. 1 and 10)

SUMMARY OF THE INVENTION

Problem to be Solved by the Invention

The optical transmitter of Patent Reference 1, however, does not include a digital diagnostic monitoring (DDM) function, such as the function of enabling a main parameter of the optical transmitter to be read in a host device in real time, and thus, a user cannot know accurate output power of a semiconductor laser unit through the host device.

A general DDM function includes the function of notifying a host device of a value of a monitor current corresponding to output power of a semiconductor laser unit (power monitor value). However, when a positional shift occurs between the semiconductor laser unit and a casing of an optical module housing the semiconductor laser unit because of, for example, thermal expansion due to a temperature variation, a ratio (efficiency) of output power of the optical module with respect to output power of the semiconductor laser unit (i.e., output power of laser light transmitted through optical a fiber held in the casing of the optical module) decreases (i.e., a tracking error occurs), and the output power of the optical module is not accurately indicated by a power monitor value notified to the host device, disadvantageously.

The present invention has been made to solve the problem described above, and has an object of providing an optical transmitter capable of maintaining constant output power of laser light output from an optical module even upon occurrence of degradation of a semiconductor laser unit with time and a temperature variation of the optical module, and capable of notifying a host device of a power monitor value accurately indicating output power of the optical module.

Means of Solving the Problem

An optical transmitter according to an aspect of the present invention includes: a semiconductor laser unit that outputs laser light of first output power corresponding to an input laser driving current and outputs a monitor current corresponding to the first output power; a casing of an optical module that includes the semiconductor laser unit and holds an optical fiber having an end disposed at a position on which the laser light hits; a monitor current detection unit that generates a monitor voltage corresponding to the monitor current; a laser driving unit that controls the laser driving current to make the monitor voltage approaches a set target voltage; a storage unit that previously stores information based on a result of a measurement of a ratio of second output power of the laser light output through the optical fiber with respect to the first output power of the semiconductor laser unit at each of a plurality of temperatures; a temperature sensor that detects an ambient temperature of the semiconductor laser unit; a target voltage determination unit that changes the target voltage using a detected temperature detected by the temperature sensor and the information based on the result of the measurement; and a power monitor value determination unit that generates a power monitor value indicating the second output power to be transmitted to a host device, using the detected temperature and the information based on the result of the measurement.

Effects of the Invention

According to the present invention, even with occurrence of degradation of a semiconductor laser device with time and a temperature variation of an optical module, constant output power of laser light output from the optical module can be maintained.

According to the present invention, it is also possible to notify a host device of an accurate power monitor value corresponding to output power of the optical module.

MODE FOR CARRYING OUT THE INVENTION

An optical transmitter according to embodiments of the present invention will be described with reference to the attached drawings. First to third embodiments below are merely examples, and various changes may be made within the range of the invention.

<1> First Embodiment
<1-1> Configuration

Figure 1:
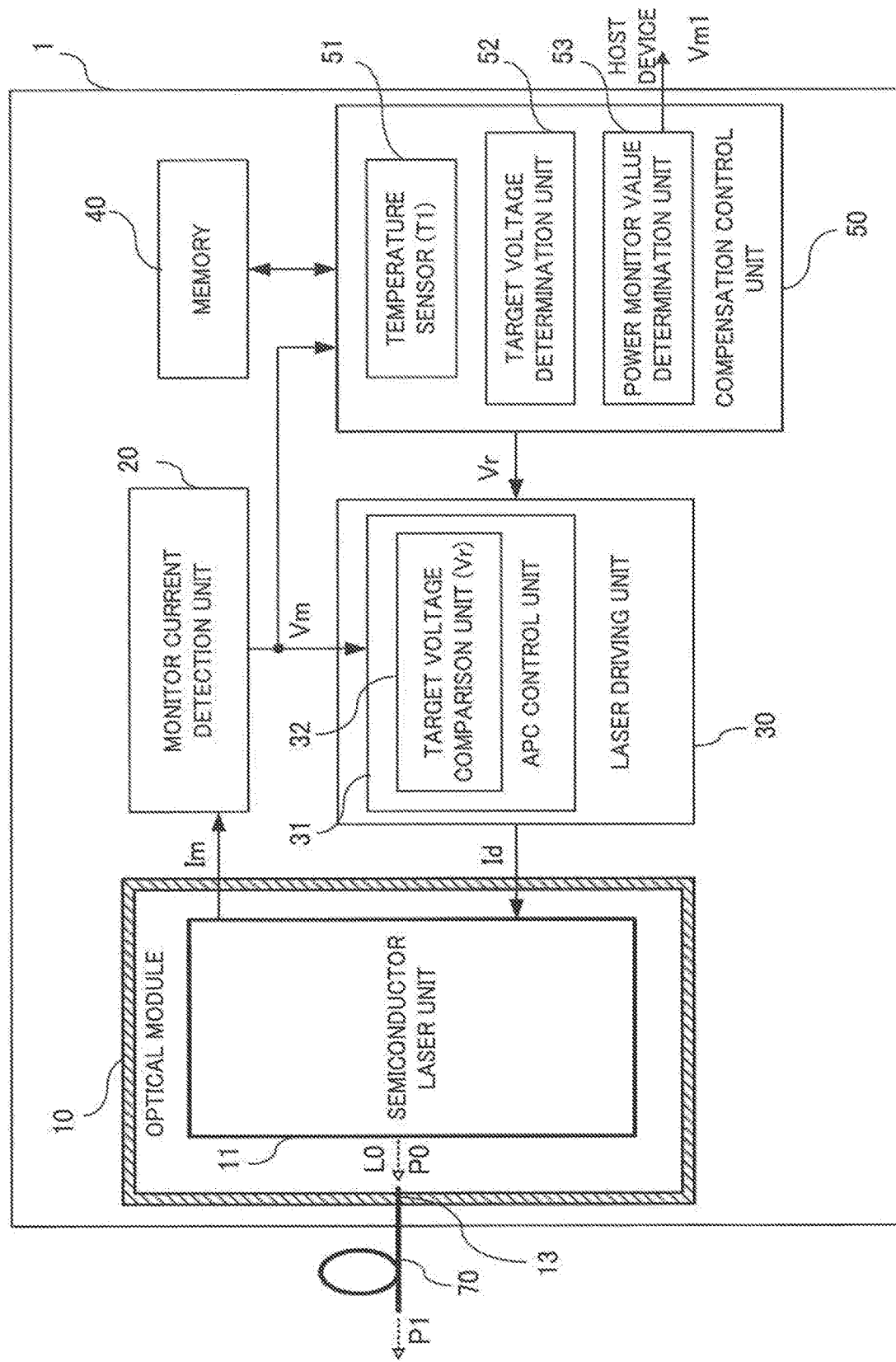
FIG. 1 is a configuration diagram schematically illustrating an optical transmitter according to a first embodiment of the present invention.

FIG. 1 is a configuration diagram schematically illustrating an optical transmitter 1 according to a first embodiment. The optical transmitter 1 is used for an optical transmission system. As illustrated in FIG. 1, the optical transmitter 1 includes an optical module 10 including a semiconductor laser unit 11 that outputs laser light L0, a monitor current detection unit 20, a laser driving unit 30, a memory 40 as a nonvolatile storage unit that stores information, and a compensation control unit 50 that performs a process for compensating for a tracking error.

The semiconductor laser unit 11 includes a laser diode (LD) as a laser light-emitting element that generates laser light, and a photodiode (PD) as a light-detecting device that detects a part of laser light and outputs a monitor current Im corresponding to output power (first output power) P0 of laser light L0. The semiconductor laser unit 11 may include a lightmodulating unit that modulates laser light in accordance with an input signal.

The optical module 10 includes a casing as a structure, a semiconductor laser unit 11 housed (fixed) in the casing, and a holder unit 13 included in the casing and holding (fixing) an optical fiber 70. Since the optical fiber 70 are held in the casing, laser light L0 emitted from a light-emitting surface of the semiconductor laser unit 11 travels toward an end of the optical fiber 70. In this manner, the light-emitting surface of the semiconductor laser unit 11 and the end of the optical fiber 70 have a predetermined positional relationship, thereby being optically coupled to each other.

A monitor current detection unit 20 receives a monitor current Im output from the PD of the semiconductor laser unit 11 and outputs a monitor voltage Vm having a value corresponding to the monitor current Im. In general, the monitor voltage Vm is proportional to the monitor current Im.

The laser driving unit 30 is a driving circuit including an APC control unit 31 that performs feedback control. The APC control unit 31 includes a target voltage comparison unit 32. The target voltage comparison unit 32 compares the monitor voltage Vm corresponding to the monitor current Im with a target voltage Vr as a reference voltage.

The compensation control unit 50 includes a temperature sensor 51, a target voltage determination unit 52, and a power monitor value determination unit 53. The temperature sensor 51 may be disposed at another location (outside the compensation control unit 50) at which the temperature sensor 51 can detect a temperature T1 of the optical module 10 (i.e., an ambient temperature of the semiconductor laser unit 11).

The compensation control unit 50 executes an adjustment process for compensating for a tracking error. The tracking error is a phenomenon in which an optical coupling state determined by a positional relationship between the light-emitting surface of the semiconductor laser unit 11 held in the casing of the optical module 10 and the end of the optical fiber 70 held by the holder unit 13 of the casing of the optical module 10 varies depending on a temperature variation of the optical module 10 (i.e., a shift in positional relationship between parts of an optical system caused by the temperature variation). The tracking error cannot be compensated for by feedback control by the APC control unit 31. In a case where a tracking error is not compensated for at the time of the occurrence of the tracking error, output power (second output power) P1 of laser light output from the optical module 10 through the optical fiber 70 decreases.

The target voltage determination unit 52 perfoLms temperature compensation on a target voltage Vr that is a reference voltage held in the target voltage comparison unit 32 using a mathematical expression previously held in the memory 40 or using information (LUT) previously held in the memory 40. That is, the target voltage determination unit 52 changes the target voltage Vr to an appropriate value based on the temperature T1 detected by the temperature sensor 51, and provides a value of the target voltage Vr compensated for by the target voltage comparison unit 32.

When the detected temperature T1 detected by the temperature sensor 51 is greatly deviated from ordinary temperature (operating temperature designed), a monitor voltage Vm proportional to the monitor current Im does not accurately indicate the output power P1 of laser light output from the optical module 10 through the optical fiber 70. Thus, the power monitor value determination unit 53 corrects the monitor voltage Vm, thereby generating a power monitor value Vm1. The power monitor value determination unit 53 corrects the monitor value Vm based on the detected temperature T1 detected by the temperature sensor 51, thereby generating the power monitor value Vm1 accurately indicating the output power P1 of the optical module 10, and executes a DDM function of providing a host device (not shown) with the power monitor value Vm1 as real-time information on the optical transmitter 1. Specifically, based on the detected temperature T1 detected by the temperature sensor 51, the power monitor value determination unit 53 compensates for the monitor voltage Vm corresponding to (e.g., proportional to) the monitor current Im and notifies the host device of the compensated monitor voltage as the power monitor value Vm1.

The compensation control unit 50 may be constituted by a control circuit, or may be implemented by the memory 40 that stores a program, which is software, and a processor as an information processing unit that executes the program. The components other than the compensation control unit 50 may be implemented by the memory 40 that stores a program and the processor.

<1-2> Operation

First, an operation at ordinary temperature, that is, in a case where tracking error compensation is not needed, will be described. In this case, the laser driving unit 30 supplies the semiconductor laser unit 11 with a laser driving current Id determined based on the monitor voltage Vm corresponding to the monitor current Im (i.e., based on the monitor current Im).

The semiconductor laser unit 11 emits light using the supplied laser driving current Id, and outputs laser light L0 of output power P0 in accordance with the supplied laser driving current Id to the end of the optical fiber 70 held by the holder unit 13 of the casing of the optical module 10.

The monitor current Im having a value in accordance with the output power P0 of the semiconductor laser unit 11 is converted to a monitor voltage Vm having a value corresponding to the monitor current by the monitor current detection unit 20, and the monitor voltage Vm is supplied to the APC control unit 31 and the compensation control unit 50.

The APC control unit 31 compares the monitor voltage Vm with the target voltage Vr in the target voltage comparison unit 32, and controls the laser driving current Id so that the monitor voltage Vm approaches the target voltage Vr (preferably the monitor voltage Vm becomes equal to the target voltage Vr). Specifically, the APC control unit 31 increases the laser driving current Id if the monitor voltage Vm is lower than the target voltage Vr, and reduces the laser driving current Id if the monitor voltage Vm is higher than the target voltage Vr.

Next, an operation in a case except for ordinary temperature, that is, a case where tracking error compensation is needed, will be described. When the structure of the optical module 10 changes due to a temperature variation in the optical transmitter 1, a coupling shift occurs between the light-emitting surface of the semiconductor laser unit 11 and a core (end) of the optical fiber 70, for example. Consequently, a ratio (efficiency) of the output power P1 of the optical module 10 with respect to the output power P0 of the semiconductor laser unit 11 (=P1/P0) changes (generally decreases) from a ratio (efficiency) at ordinary temperature.

The APC control unit 31 perfoims feedback control based on the value of the monitor current Im corresponding to the output power P0 of the semiconductor laser unit 11, that is, the value of the monitor current Vm converted from the monitor current Im by the monitor current detection unit 20. As described above, the feedback control by the APC control unit 31 does not consider a change of the ratio (efficiency) of the output power P1 of the optical module 10 with respect to the output power P0 of the semiconductor laser unit 11. Thus, if the temperature of the optical module 10 greatly changes from room temperature, the output power P1 of the optical module 10 is shifted (generally decreases) from the output power of the optical module 10 at room temperature, and a tracking error occurs.

In the first embodiment, a tracking error in a temperature range (specification temperature range) allowable in specifications of the optical transmitter 1 is measured beforehand, and information based on a result of the measurement is previously stored in the memory 40 as a look up table (LUT) or a mathematical expression. The compensation may be performed using a mathematical expression or using an LUT.

The target voltage determination unit 52 of the compensation control unit 50 changes the target voltage Vr of the target voltage comparison unit 32 so that the output power PO of the semiconductor laser unit 11 increases or decreases, using the detected temperature T1 detected by the temperature sensor 51 and information based on a result of a measurement of a tracking error stored in the memory 40, thereby compensating for a tracking error.

In the first embodiment, the laser driving current Id itself is not rewritten, but temperature compensation is performed on the target voltage Vr of the target voltage comparison unit 32 that is a feedback point. With such control of updating the target voltage Vr (e.g., increasing the target voltage Vr), an influence of degradation of the output power P0 with time on the laser driving current Id of the semiconductor laser unit 11 can be eliminated (i.e., a decrease in the output power P0 of the optical module 10 can be avoided).

In addition, in the first embodiment, control of maintaining constant output power P1 of the optical module 10 (feedforward control) is performed using the detected temperature T1 detected by the temperature sensor 51 and the information (LUT or mathematical expression) based on the result of the measurement previously stored in the memory 40. Thus, tracking error compensation with respect to a temperature variation of the optical module 10 can be appropriately performed.

<1-3> Advantages

As described above, in the optical transmitter 1 according to the first embodiment, even in a case where the semiconductor laser unit 11 deteriorates with time and the temperature of the optical module 10 variates, control of updating the target voltage Vr is performed, and thus it is possible to maintain constant output power P1 of laser light output from the optical module 10 through the optical fiber 70, by performing feedback control.

In the optical transmitter 1 according to the first embodiment, the power monitor value determination unit 53 supplies a host device with the power monitor value Vm1 compensated for based on tracking error compensation information. Thus, the host device can be notified of the accurate power monitor value Vm1 corresponding to the output power P1 of the optical module 10. As a result, the DDM function of the optical transmitter 1 can be normally maintained.

<2> Second Embodiment

The first embodiment provides a description of the optical transmitter 1 that performs APC control on the laser driving current Id based on the monitor current Im by making the target voltage determination unit 52 update the target voltage Vr by using the detected temperature T1 detected by the temperature sensor 51 and information based on the previously stored a result of a measurement and performs auto current control (ACC) by performing tracking error compensation.

However, in a case where an optical transmitter is disposed in an environment with a large temperature variation range, such as a case where the optical transmitter is disposed outdoors, or a case where high output power is required for the optical transmitter and the laser driving current Id is almost reaching the upper limit of the laser driving current Id that can be supplied by the laser driving unit 30, constant output power P1 of laser light output from the optical module 10 cannot be maintained only by feedback control by increasing or reducing the laser driving current Id.

In view of this, in the second embodiment, a thermoelectric element 12 capable of cooling or heating the semiconductor laser unit 11 is provided in the optical module 10 (near the semiconductor laser unit 11), and a thermoelectric element driving unit 60 sets a temperature (thermoelectric element temperature) Tld of the thermoelectric element 12, and thus tracking error compensation is performed. The thermoelectric element 12 is, for example, a Peltier element. The thermoelectric element driving unit 60 is, for example, a thermo-electric cooler (TEC) controller that controls a thermoelectric element that generates heat or cools.

Figure 2:
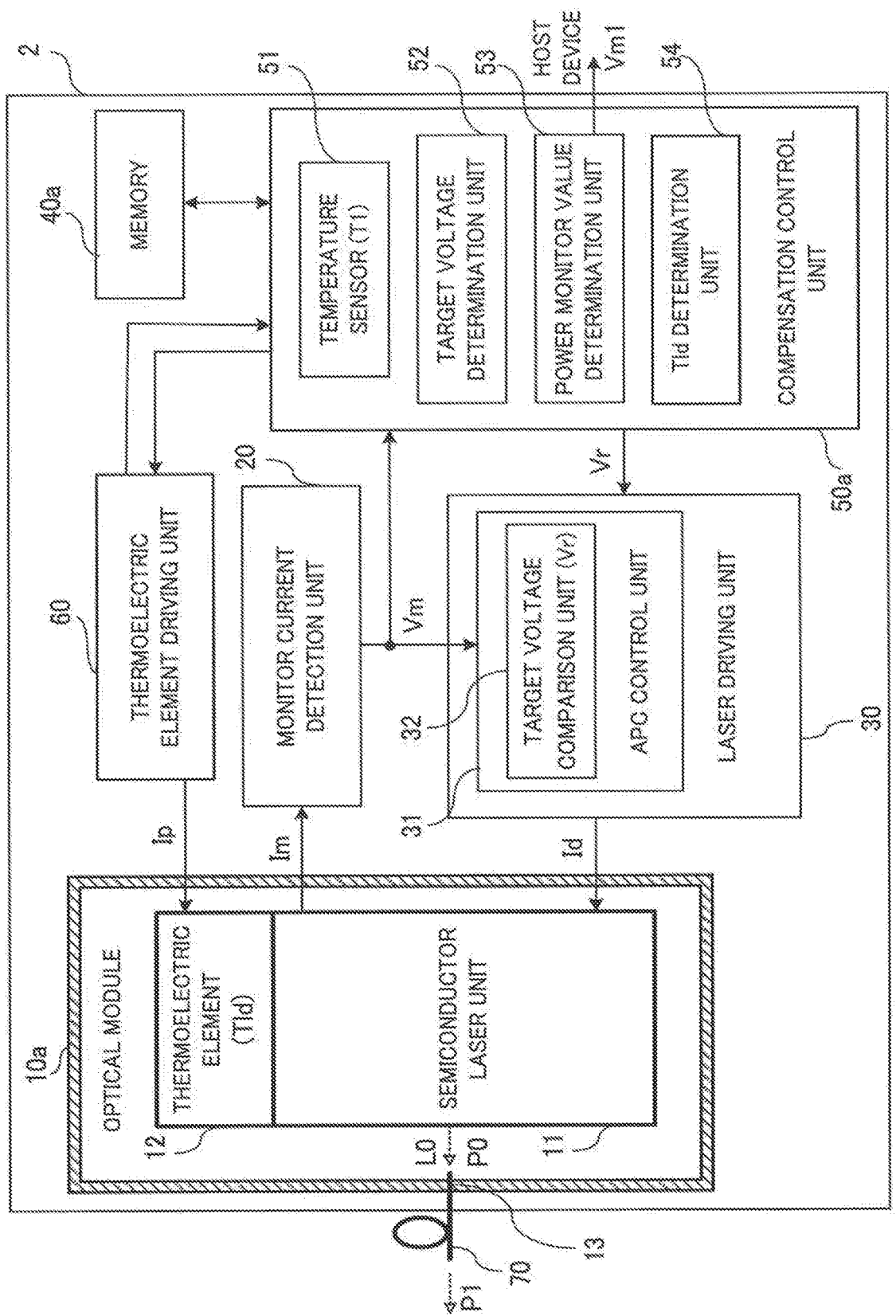
FIG. 2 is a configuration diagram schematically illustrating an optical transmitter according to a second embodiment of the present invention.

FIG. 2 is a configuration diagram schematically illustrating an optical transmitter 2 according to the second embodiment. In FIG. 2, the same reference characters as those in FIG. 1 designate the same or like components as those illustrated in FIG. 1.

In general, in the semiconductor laser unit 11, a conversion efficiency of output power P0 with respect to a laser driving current Id varies depending on a temperature of the semiconductor laser unit 11. That is, the conversion efficiency increases with a temperature decrease, whereas the conversion efficiency decreases with a temperature increase. Thus, even in a case where the same laser driving current Id flows in the laser driving unit 30, the laser driving current Id of the laser driving unit 30 can be further increased by reducing the thermoelectric element temperature Tld by the thermoelectric element driving unit 60. In other words, even in a case where the laser driving current Id has reached a predetermined upper limit, the output power P0 of the semiconductor laser unit 11 can be further increased by reducing the temperature of the semiconductor laser unit 11.

As described above, in the second embodiment, by using, as a trigger, a condition that when the laser driving current Id of the laser driving unit 30 reaches a predetermined upper limit, a detected temperature T1 detected by a temperature sensor 51 has reached a predetermined threshold temperature, it is possible to perform tracking error compensation by lowering the thermoelectric element temperature Tld supplementarily.

A thermoelectric element temperature determination unit (Tld determination unit) 54 determines the degree of change of the thermoelectric element temperature Tld by using information based on a previously acquired result of a measurement. For example, the thermoelectric element temperature Tld may be determined using a mathematical expression previously obtained based on the result of the measurement stored in a memory 40, or may be determined using an LUT previously stored in the memory 40 based on the result of the measurement.

A compensation control unit 50a may be constituted by a control circuit, or may be implemented by a memory 40a that stores a program, which is software, and a processor as an information processing unit that executes the program. The components other than the compensation control unit 50a may be implemented by the memory 40 that stores a program and a processor.

Figure 3:
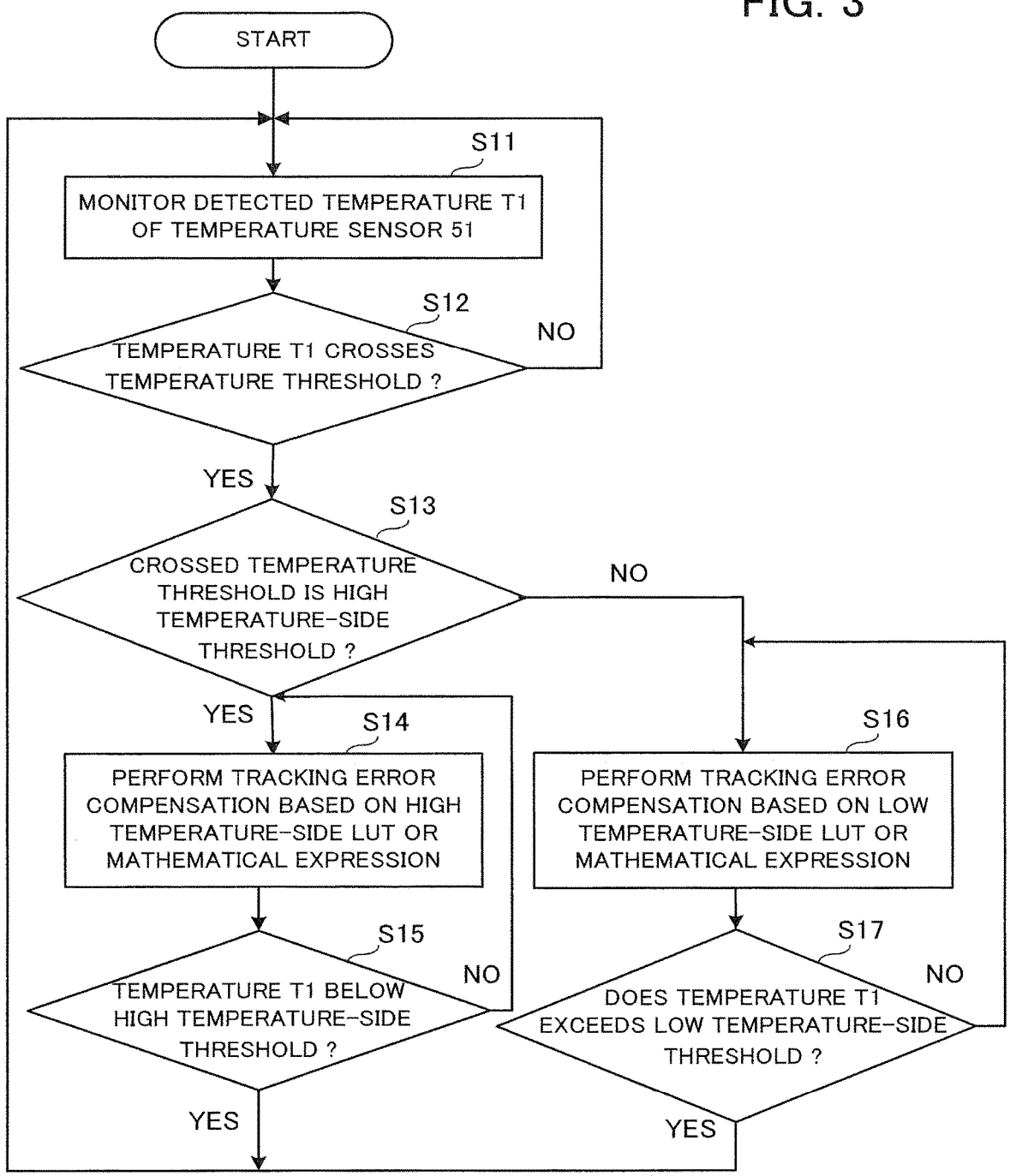
FIG. 3 is a flowchart indicating a tracking error compensation operation of the optical transmitter according to the second embodiment.

FIG. 3 is a flowchart indicating a process of compensation by the thermoelectric element 12 in a case where the detected temperature T1 crosses (passes through) a predetermined temperature threshold (high-temperature side or low-temperature side).

In step Sil in FIG. 3, the compensation control unit 50a monitors the detected temperature T1 detected by the temperature sensor 51. In step S12, when the detected temperature T1 crosses the predetermined temperature threshold (i.e., exceeds a high temperature-side threshold or decreases below a low temperature-side threshold), tracking error compensation is started by controlling the thermoelectric element temperature Tld.

In step S12, when the determination result is YES, the process proceeds to step S13. In step S13, the compensation control unit 50a determines whether the passed temperature threshold is a high temperature-side threshold or a low temperature-side threshold.

When the passed temperature threshold is the high temperature-side threshold (YES in step S13), the process proceeds to step S14. In step S14, the Tld determination unit 54 of the compensation control unit 50a performs tracking error compensation at the detected temperature T1 by using a high temperature-side LUT or a high temperature-side mathematical expression stored in the memory 40a. Specifically, the Tld determination unit 54 obtains a thermoelectric element temperature Tld in the detected temperature T1 by using the high temperature-side LUT or the high temperature-side mathematical expression stored in the memory 40a and supplies the obtained thermoelectric element temperature Tld to the thermoelectric element driving unit 60.

The process in step S14 is repeated until the detected temperature T1 decreases below the high temperature-side threshold in next step S15. In step S15, when the detected temperature T1 decreases below the high temperature-side threshold, the process returns to step S11. However the tracking error compensation process by adjusting the thermoelectric element temperature Tld may be terminated at this time.

In step S13, when a result of the determining is NO, the passed temperature threshold is the low temperature-side threshold, the process proceeds to step S16. In step S16, the Tld determination unit 54 of the compensation control unit 50a performs tracking error compensation at the detected temperature T1 by using a low temperature-side LUT or a low temperature-side mathematical expression stored in the memory 40a. Specifically, the Tld determination unit 54 obtains the thermoelectric element temperature Tld in the detected temperature T1 by using the low temperature-side LUT or the low temperature-side mathematical expression stored in the memory 40a and supplies the obtained thermoelectric element temperature Tld to the thermoelectric element driving unit 60.

The process in step S16 is repeated until the detected temperature T1 exceeds the low temperature-side threshold in next step S17. In step S17, when the detected temperature T1 exceeds the low temperature-side threshold, the process returns to step S11. However the tracking error compensation by adjusting the thermoelectric element temperature Tld may be terminated at this time. The temperature threshold to be used for determination to start tracking error compensation by adjustment of the thermoelectric element temperature Tld, and the temperature threshold to be used for determination to terminate the tracking error compensation may be set at different values.

As described above, the optical transmitter 2 according to the second embodiment can obtain the following advantage in addition to the advantages described in the first embodiment.

In the optical transmitter 2 according to the second embodiment, even in the case where the same laser driving current Id flows in the laser driving unit 30, the output power P0 of the semiconductor laser unit 11 can be further increased by reducing the temperature Tld of the thermoelectric element 12 with the thermoelectric element driving unit 14 even when the laser driving current Id has reached a predetermined upper limit.

In the other respects, the second embodiment is the same as the first embodiment.

<3> Third Embodiment

In second embodiment, a case where tracking error compensation is performed by controlling the target voltage Vr and the thermoelectric element temperature Tld has been described. However, when the thermoelement driving current Ip and the laser driving current Id increase, power consumption amount in the optical transmitter increases.

In view of this, an optical transmitter according to a third embodiment employs a processing method for reducing current consumption as much as possible in the case of performing tracking error compensation on the premise of a change of the thermoelectric element temperature Tld.

The third embodiment is different from the second embodiment in how the compensation control unit 50a controls (i.e., control for minimizing power consumption). In the other respects, the third embodiment is the same as the second embodiment. Thus, the third embodiment will be described also with reference to FIG. 2.

Figure 4:
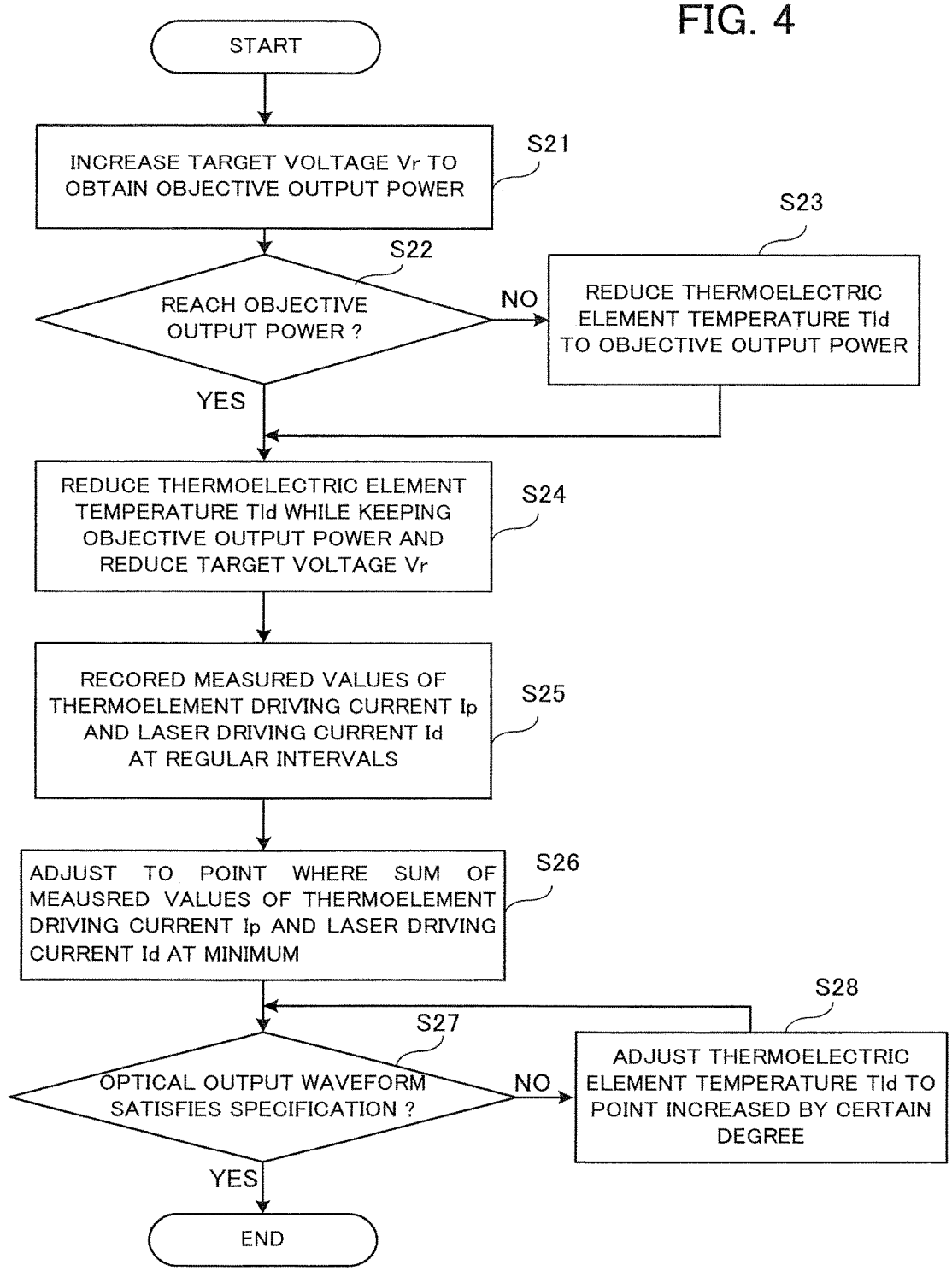
FIG. 4 is a flowchart indicating an adjustment process of a laser driving current and a thermoelement driving current in an optical transmitter according to a third embodiment of the present invention.

FIG. 4 is a flowchart indicating an adjustment process of a laser driving current Id and a thermoelement driving current Ip in the optical transmitter according to the third embodiment.

When the temperature of a thermoelectric element 12 is lower than an initial temperature Tld (room temperature), a temperature Ta of an optical module 10 decreases below the initial temperature Tld of the thermoelectric element 12, and a light-emitting efficiency increases as the temperature decreases. Thus, when the thermoelectric element temperature Tld is reduced (i.e., the thermoelement driving current Ip is reduced), output power P1 of the optical module 10 increases. As described above, in low temperature-side control (control while a detected temperature T1 is less than a predetermined temperature), the light-emitting efficiency increases by reducing the thermoelement driving current Ip, that is, the light-emitting efficiency increases by reducing power consumption. Thus, control of performing tracking error compensation while reducing power consumption can be easily performed.

Thus, in FIG. 4, the adjustment process at temperatures higher than room temperature (a process in a case where the detected temperature T1 is a predetermined temperature or more) will be described. First, in step S21, at an adjustment point from room temperature to a high temperature (a plurality of points are employed), a compensation control unit 50a increases a target voltage Vr of a target voltage comparison unit 32 in an APC control unit 31 so that output power P0 reaches target output power near a center of a specification temperature range.

In next step S22, the compensation control unit 50a determines whether the output power P0 of laser light has reached the target output power from a monitor voltage Vm.

When a result of the determining in step S22 is NO, that is, when objective output power cannot be obtained only by a change of the target voltage Vr (a change of a laser driving current Id), the compensation control unit 50a reduces the thermoelectric element temperature Tld and performs control for achieving the objective output power in step S23.

In next step S24, the compensation control unit 50a gradually reduces the thermoelectric element temperature Tld while keeping the objective output power unchanged, and gradually reduces the target voltage Vr of the target voltage comparison unit 32 in the APC control unit 31. In step S25, the compensation control unit 50a stores a measured value of the thermoelement driving current Ip and a measured value of the laser driving current Id in a memory 40a at regular intervals (e.g., at every change of the thermoelectric element temperature Tld by 1° C.)

When the thermoelectric element temperature Tld reaches a predetermined upper limit of a variable value of the thermoelectric element temperature Tld, the compensation control unit 50a stops adjustment, and in step S26, sets the thermoelectric element temperature Tld and the target voltage Vr of the target voltage comparison unit 32 in the APC control unit 31, at a point at which the sum of the two measured values (i.e., the measured value of the thermoelement driving current Ip and the measured value of the laser driving current Id) in the stored thermoelectric element temperatures Tld is at minimum.

Subsequently, in step S27, the compensation control unit 50a determines characteristics except for optical output power.

In a case where the optical module 10 includes a modulation element, an oscillation wavelength changes depending on a change of the thermoelectric element temperature Tld. Thus, characteristics such as an extinction ratio can change because of an absorption wavelength characteristic of the modulation element. Thus, an output waveform of laser light is checked, and if characteristics are not satisfied, the thermoelectric element temperature Tld is increased by a predetermined certain degree (e.g., 1° C.) in step S28, and characteristics except for optical output power are determined again.

At the time when all the characteristics satisfy specifications, adjustment is finished.

The process indicated in FIG. 4 is performed at a plurality of temperatures so that a fitting curve of the thermoelectric element temperature Tld and the target voltage Vr of the APC control unit 31 is created. The fitting curve is represented by a function (mathematical expression) or an LUT, for example, and information thereof is previously stored in the memory 40a. In tracking error compensation, the compensation control unit 50a performs correction by using a mathematical expression or an LUT stored in the memory 40a.

Figures 5A, 5B, 5C:
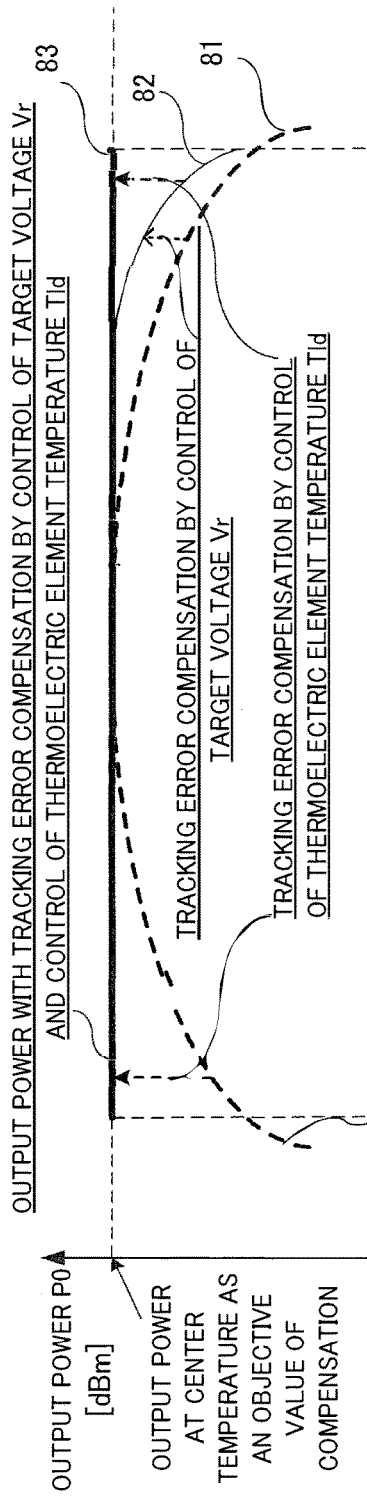
FIGS. 5(a) to 5(c) are diagrams for describing a tracking error compensation operation in the optical transmitter according to the third embodiment.

FIGS. 5(a) to 5(c) are diagrams showing examples of fitting curves of a tracking error compensation operation in the optical transmitter according to the third embodiment.

A curve 81 indicated by a broken line in FIG. 5(a) represents output power P0 in the case of performing no tracking error compensation. As represented by the curve 81, in the case of performing no tracking error compensation, output power is at maximum near the center in the specification temperature range, and decreases as the distance from the center in the specification temperature range increases.

In FIG. 5(a), when tracking error compensation by controlling the target voltage Vr is performed on the output power curve (curve indicated by the broken line) 81, the output power curve becomes a curve denoted by reference numeral 82 (thin solid line), whereas when tracking error compensation by controlling the thermoelectric element temperature Tld is performed, the output power curve becomes a curve denoted by reference numeral 83 (bold line).

As shown in FIG. 5(a), at temperatures lower than room temperature (substantially the middle on the horizontal axis), when the driving current Ip of the thermoelectric element 12 is reduced, output power of the optical module 10 increases, whereas when the laser driving current Id is increased, the output power of the optical module 10 increases. Thus, to obtain output power while reducing current consumption (power consumption) at lower temperatures, it is preferable to reduce the driving current Ip of the thermoelectric element 12, rather than to increase the laser driving current Id. That is, it is possible to reduce power consumption by performing control to maintain constant output power by using only the thermoelectric element temperature Tld. However, if the thermoelectric element temperature Tld is lowered, there is a possibility that characteristics other than the output power of the optical transmitter are changed. Thus, in such a case, the thermoelectric element temperature Tld may be controlled together with the target voltage Vr of the target voltage comparison unit 32 in the APC control unit 31 in a manner similar to the control at temperatures higher than room temperature.

FIG. 5(b) shows an example of a compensation function curve 84 of a tracking error by controlling the thermoelectric element temperature Tld. The curve 84 indicates that output power of laser light is increased by reducing the thermoelectric element temperature Tld at temperatures lower than room temperature. A profile indicated by the curve 84 at high temperatures greatly varies depending on, for example, the efficiency of the semiconductor laser unit 11, and the profile may be that other than the profile in FIG. 5(b) in some cases.

FIG. 5(c) shows an example of a compensation function curve 85 of the target voltage Vr of the target voltage comparison unit 32. In the case of using the optical transmitter in an environment at a wide temperature range, a tracking error cannot be appropriately compensated for only by controlling the laser driving current Id. Thus, an optimum point is obtained by combining adjustment of the target voltage Vr and adjustment of the thermoelectric element temperature Tld.

As described above, the optical transmitter according to the third embodiment can obtain the following advantage in addition to the advantages of the first and second embodiments.

The optical transmitter according to the third embodiment is controlled so that the sum of the laser driving current Id and the thermoelement driving current Ip can be minimized, and thus, power consumption can be reduced.

In the other respects, the third embodiment is the same as the second embodiment.

DESCRIPTION OF REFERENCE CHARACTERS

1, 2 optical transmitter, 10, 10a optical module, 11 semiconductor laser unit, 12 thermoelectric element, 13 holder unit, 20 monitor current detection unit, 30 laser driving unit, 31 APC control unit (optical power control unit), 32 target voltage comparison unit, 40, 40a memory (storage unit), 50, 50a compensation control unit, 51 temperature sensor, 52 target voltage determination unit, 53 power monitor value determination unit, 54 Tld determination unit (thermoelectric element temperature determination unit), 60 thermoelectric element driving unit, 70 optical fiber, L0 laser light, P0 output power (first output power), P1 output power (second output power), Id laser driving current, Im monitor current, Ip thermoelement driving current, T1 detected temperature, Tld thermoelectric element temperature, Vm monitor voltage, Vml power monitor value, Vr target voltage.

What is claimed is:

1. An optical transmitter comprising:
   a semiconductor laser unit to output laser light of first output power corresponding to an input laser driving current and to output a monitor current corresponding to the first output power;
   a casing of an optical module to include the semiconductor laser unit and to hold an optical fiber having an end disposed at a position on which the laser light hits;
   a monitor current detection unit to generate a monitor voltage corresponding to the monitor current;
   a laser driving unit to control the laser driving current to make the monitor voltage approaches a set target voltage;
   a storage unit to store previously information based on a result of a measurement of a ratio of second output power of the laser light output through the optical fiber with respect to the first output power of the semiconductor laser unit at each of a plurality of temperatures;
   a temperature sensor to detect an ambient temperature of the semiconductor laser unit;
   a target voltage determination unit to change the target voltage using a detected temperature detected by the temperature sensor and the information based on the result of the measurement; and
   a power monitor value determination unit to generate a power monitor value indicating the second output power to be transmitted to a host device, using the detected temperature and the information based on the result of the measurement.

2. The optical transmitter according to claim 1, further comprising:
   a thermoelectric element to maintain a thermoelectric element temperature in accordance with an input thermoelement driving current, the thermoelectric element being disposed near the semiconductor laser unit;
   a thermoelectric element driving unit to supply the thermoelement driving current to the thermoelectric element; and
   a thermoelectric element temperature determination unit to determine the thermoelectric element temperature of the thermoelectric element and to supply an instruction signal of the thermoelectric element temperature to the thermoelectric element driving unit.

3. The optical transmitter according to claim 2, further comprising a compensation control unit to control the laser driving current and the thermoelement driving current so that a sum of the laser driving current and the thermoelement driving current is at minimum when the detected temperature is greater than or equal to a predetermined temperature.

4. The optical transmitter according to claim 3, wherein the compensation control unit controls the first output power by controlling the thermoelement driving current when the detected temperature is less than the predetermined temperature.

* * * * *